United States Patent [19]

Dhillon

[11] Patent Number: 4,914,000

[45] Date of Patent: Apr. 3, 1990

[54] THREE DIMENSIONAL REPRODUCTION MATERIAL DIAZONIUM CONDENSATES AND USE IN LIGHT SENSITIVE

[75] Inventor: Major S. Dhillon, Belle Mead, N.J.

[73] Assignee: Hoechst Celanese Corporation, Somerville, N.J.

[21] Appl. No.: 151,813

[22] Filed: Feb. 3, 1988

[51] Int. Cl.$^4$ .................. G03C 1/54; C07C 113/04
[52] U.S. Cl. ................... 430/157; 430/171; 430/175; 430/176; 430/302; 534/559; 534/560; 534/561; 534/565
[58] Field of Search ............ 430/171, 175, 176, 193, 430/192, 302, 157; 534/559, 560, 561, 565

[56] References Cited

U.S. PATENT DOCUMENTS

| | | | |
|---|---|---|---|
| 3,046,118 | 7/1962 | Schmidt | 430/193 |
| 3,155,512 | 11/1964 | De Boev | 430/175 |
| 4,215,041 | 7/1980 | Phlipot et al. | 430/175 |
| 4,275,138 | 6/1981 | Kita et al. | 430/176 |
| 4,299,907 | 11/1981 | Burkle et al. | 430/175 |
| 4,436,804 | 3/1984 | Walls | 430/175 |
| 4,749,639 | 6/1988 | Frommold | 430/175 |

FOREIGN PATENT DOCUMENTS 565734 6/1984 Australia .................. 430/192

*Primary Examiner*—Charles L. Bowers, Jr.
*Attorney, Agent, or Firm*—Plottel & Roberts

[57] ABSTRACT

A light-sensitive compound having the formula:

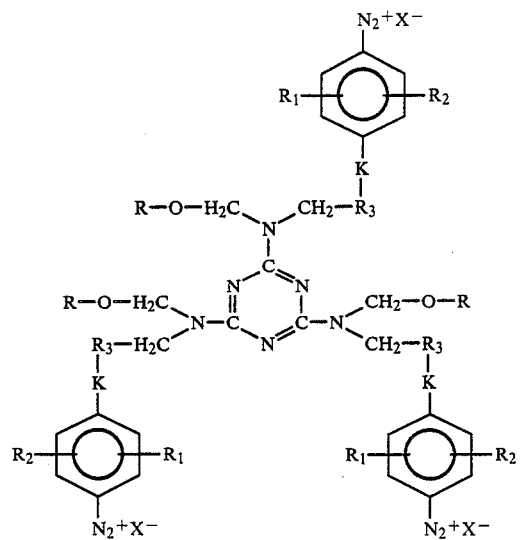

wherein
$R_3$ is selected from the group consisting of phenyl and $C_1$ to $C_4$ alklyl substituted phenyl.
—K— is selected from the group consisting of

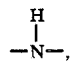

—S—, —O—, and —CH$_2$—, or is absent;
$R_1$ and $R_2$ are independently selected from the group consisting of $C_1$ to $C_4$ alkyl, methoxy, ethoxy, butoxy, and H;
X— is an anion; and
R denotes a hydrogen atom or a $C_1$ to $C_4$ alkyl group.

21 Claims, No Drawings

THREE DIMENSIONAL REPRODUCTION MATERIAL DIAZONIUM CONDENSATES AND USE IN LIGHT SENSITIVE

BACKGROUND OF THE INVENTION

This invention relates to novel light-sensitive condensation products of aromatic diazonium salts, processes for preparation thereof, and to light-sensitive reproduction materials, which latter comprise a support having a reproduction layer thereon containing at least one of the novel light-sensitive products.

It is known to use light-sensitive aromatic diazonium compounds for sensitizing reproduction materials which are useful for the production of single copies, printing plates, screen pringint, color proofing foils and other applications in the reproduction arts.

U.S. Pat. Nos. 3,867,147, 3,679,419 and 3,849,392 relating to fixed diazo condensates, the contents of which are thereby incorporated by reference, describe an advance overcoming disadvantages of prior art diazo compounds and reproductive layers made therefrom.

Diazonium compounds conventionally known as light-sensitive agents for making light-sensitive lithographic printing plates can be divided into two kinds depending on their specific properties. That is, one kind is a diazonium compound capable of being decomposed by exposure into an oleophilic material and the other kind is a diazo compound capable of being converted by exposure into an alkali-soluble substance. When a composition containing the former kind of compound is applied on a hydrophilic support and the support is exposed to light through a transparent or translucent negative original, only the exposed portions are rendered hydrophobic and organophilic, that is, water repellant and ink receptive, and the unexposed portions can easily be removed with water or a phosphate solution whereby a positive image can be obtained. Such a system is described in detiel in U.S. Pat. No. 2,714,066. On the other hand, when a composition containing the latter kind of compound is dissolved in an organic solvent, applied to a hydrophilic support and after exposure is developed by an alkaline solution, the exposed portions are dissolved out also to provide a positive image. Such a system is described in detail in U.S. Pat. Nos. 3,046,122 and 3,046,123.

The compounds described in the above-mentioned U.S. Pat. specifications are low-molecular weight compounds and hence if such a compound is used individually it is deposited in crystalline form which results in lowering the mechanical strength of the image obtained and making long press runs difficult to attain. Accordingly, a resin such as a phenol-formaldehyde resin, shellac or styrene-maleic anhydride resin is used as a carrier for the compound to prevent the light-sensitive layer from crystallizing and to compensate for any weakening of the mechanical strength. However, if materials other than a light-sensitive agent are incorporated into the light-sensitive layer there is a tendency to reduce the sharpness of the light-sensitive layer to development. In order to overcome such a difficulty, it is disclosed in U.S. Pat. No. 3,046,120 that the light-sensitive agent itself is converted into a high molecular weight compound. However, if an aluminum plate is used as a support, the adhesive property of the compound described in the specification of the above U.S. Pat. with the aluminum plate is low, which results in reducing the mechanical strength of the image, and hence the practical value of such a plate is low.

Therefore, an object of the present invention is to provide a lightsensitive lithographic printing plate containing an improved light-sensitive agent unaccompanied by the above-mentioned drawbacks. Other objects of this invention are to form a coating having sufficient film strength without the necessity of adding other film-forming agents as well as to increase the adhesive property between an aluminum plate and the coating thereon which enhances length of run performance. A further object is to provide a sensitizer capable of being converted to a high molecular state and at the same time having a good film-forming capability.

The thereby produced photosensitive resin effectively serves as both the photosensitive component and the binder resin simultaneously without requiring the use of additional binding resins.

State of the art diazo polymers available to data are the two dimensional products obtained by condensing diazo monomers with compounds containing aldehydes, methoxymethyl, hydroxyl, carbonyl and analogous groups. It is an object of this invention to obtian three dimensional diazo polymers capable of providing enhanced toughness to the diazo resin; to keep some reactive sites in the three dimensional diazo polymer open which can be made available for further reactions, i.e., cross-linking.

SUMMARY OF THE INVENTION

A light sensitive compound having the formula:

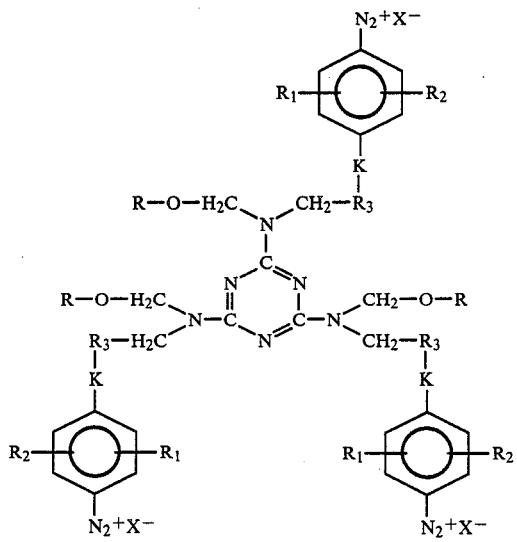

wherein
$R_3$ is selected from the group consisting of phenyl and $C_1$ to $C_4$ alkyl substituted phenyl.
—K— is selected from the group consisting of

—S—, —O—, and —CH$_2$—, or is absent;
$R_1$ and $R_2$ are independently selected from the group consisting of $C_1$ to $C_4$ alkyl, methoxy, ethoxy, butoxy, and H;
X- is an anion; and R denotes a hydrogen atom or a $C_1$ to $C_4$ alkyl group.

The invention also provides a photograpic element which comprises a substrate, and a light-sensitive composition disposed on said substrate, said light-sensitive composition comprises a compound having the above formula.

DETAILED DESCRIPTION OF THE PREFERRED EMBODIMENT

In the production of the light-sensitive compounds of this invention, one begins with a cyclical acid amide of the general formula:

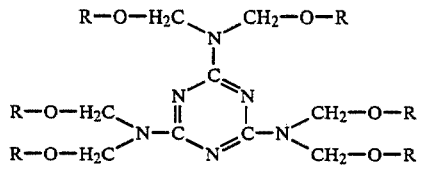

wherein R denotes a hydrogen atom or an alkyl group.

Since hexamethylol melamine is soluble in organic solvents only with difficulty, the corresponding, at least partially etherified compounds are preferably employed. In general, methyl ethers are particularly preferred. Further, the hexaalkyl ethers are usually preferred over the partially etherified compounds.

This is then reacted with a diazonium salt in the presence of an acid whereby the resin acquire the light-sensitive diazo function.

Condensations are normally conducted in strong acid media. Suitable acids include $H_3PO_4$, $H_2SO_4$, HCl, HBr, $HPF_6$, at concentrations of 70-100%. Preferred acids are $H_3PO_4$ and $H_2SO_4$. For $H_2SO_4$, 96% (w/w) is a preferred concentration when this acid is used. The diazonium salts may also be prehomocondensed.

Non-exclusive examples of diazonium salts suitable in this invention may be represented by the formula:

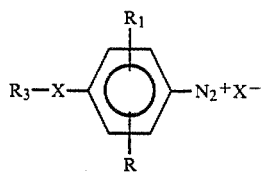

wherein $R_3$ is selected from the group consisting of phenyl and $C_1$ to $C_4$ alkyl substituted phenyl;

—K— is selected from the group consisting of

—S—, —O—, and —$CH_2$—, or is absent;

$R_2$ and $R_1$ are independently selected from the group consisting of $C_1$ to $C_4$ alkyl, methoxy, ethoxy, butoxy, and H;

X— is an anion;

Where $R_3$ is a substituted phenyl in the above formula, the substituent group is preferably located in the para position and its preferred substitutent group is methyl, i.e., p-tolyl.

Preferred anions are selected from the group consisting of $SO_4^=$, $HSO_4^-$, $SO_3^=$, $HSO_3^-$, $PO_4^-$, $HPO_4^=$, $Cl^-$, $Br^-$ and $F^-$.

Individual suitable diazo monomers include but are not restricted to the following:
Diphenylamine-4-diazonium chloride,
Diphenylamine-4-diazonium bromide,
Diphenylamine-4-diazonium sulfate,
3-methoxy-diphenylamine-4-diazonium sulfate,
3-methoxy-diphenylamine-4-diazonium chloride,
3-methoxy-diphenylamine-4-diazonium bromide,
3-ethoxy-diphenylamine-4-diazonium chloride,
3-ethoxy-diphenylamine-4-diazonium bromide,
3-ethoxy-diphenylamine-4-diazonium sulfate,
2-methoxy-diphenylamine-4-diazonium chloride,
2-methoxy-diphenylamine-4-diazonium sulfate,
4-methoxy-diphenylamine-4-diazonium sulfate,
4-methoxy-diphenylamine-4-diazonium chloride,
4-methyl-diphenylamine-4-diazonium chloride,
4-methyl-diphenylamine-4-diazonium sulfate,
3-methyl-diphenylamine-4-diazonium chloride,
3-methyl-diphenylamine-4-diazonium sulfate,
3-ethyl-diphenylamine-4-diazonium chloride,
3,3-Bis-methyl-diphenylamine-4-diazonium chloride,
3-methyl-6-methoxy-diphenylamine-4-diazonium chloride,
2-methyl-5-cloro-diphenylamine-4-diazonium sulfate,
3-chloro-diphenyulamine-4-diazonium sulfate,
Diphenylamine-4-diazonium chloride 2-carboxylic acid,
3-isopropyloxy-diphenylamine-4-diazonium chloride,
4-n-butyloxy-diphenylamine-4-diazonium chloride,
2,5-diethoxy-diphenylamine-4-diazonium chloride,
4-methoxy-2-ethoxy-diphenylamine-4-diazonium chloride,
3-isoamyloxy-diphenylamine-4-diazonium chlorde, 3,4-dimethoxydiphenylamine-4-diazonium chloride,
2-n-propyloxy-diphenylamine-4-diazonium chloride,
2-n-butyloxy-diphenylamine-4-diazonium chloride,
4-(4-methoxy-phenylmercapto)-2,5-diethoxy-benzenediazonium chloride.

Additional suitable diazo monomers include:
4-diazo-2,5-diethoxy-1-(4-tolylmercapto)benzene chloride,
4-diazo-2,5-diethoxy-1-(4-tolylmercapto)benzene sulfate,
4-diazo-2,5-diethoxy-1-(4-tolylmercapto)benzene bromide.

It is to be understood that the anions shown with their specific cations above, may in most cases be interchanged and selected from the anions given with the general formula for diazo monomers shown supra.

In conducting the condensation reaction diazo monomers are used such as phsophates, chlorides, bromides, sulfates, nitrates, or fluorides.

The light-sensitive diazonium compound prepared according to the invention may be used in reproduction layers in the conventional way. They may be dissolved in water or solvents and coated on supports to form printing plates, color proofing foils, resists for printed circuitry and the like.

The diazonium containing resin is preferably present in a coating composition of the subject invention at a percent solids lvel of from about 0.01% to about 20.0% by weight. More preferably it is present at about 0.1% to about 5% by weight and most preferably the diazonium salt is present at a percent solids level of from about 1.0% to about 2.0% by weight.

Other components which may be optionally included in the coating composition of this invention include acid stabilizers, exposure indicators, plasticizers, photoactivators, wetting agents and colorants. Binders are not preferred for this invention although a small amount may optionially be included.

Such are described in U.S. Pat. 3,679,419 which is incorporated by reference.

Suitable acid stabilizers useful within the context of this invention include phosphoric, citric, benzoic, m-nitro benzoic, p(p-anilino phenylazo) benzene sulfonic acid, 4,4'-dinitro-2,2'-stilbene disulfonic, itaconic, tartaric and p-toluene sulfonic acid and mixtures thereof. Preferably, the acid stabilizer is phosphoric acid. When used, the acid stabilizer is preferably present in the radiation-polymerizable composition in the amount of from about 0.3% to about 20.0% and most preferably from about 1.5% to about 7.5%, although the skilled artisan may use more or less as desired. Exposure indicators (or photoimagers) which may be useful in conjunction with the present invention include 4-phenylazodiphenylamine, eosin, azobenzene, Calcozine Fuchine dyes and Crystal Violet and Methylene Blue dyes. Preferably, the exposure indicator is 4-phenylazodiphenylamine. The exposure indicator, when one is used, is preferably present in the composition in an amount of from about 0.001% to about 0.35% by weight. A more preferred range is from about 0.002% to about 0.3% and, most preferably, the exposure indicator is present in an amount of from about 0.005% to about 0.20%, although the skilled artisan may use more or less as desired.

The photoactivator which may be included in the composition of this invention should be an amine-containing photoactivator. Suitable photoactivators include 2-(N-butoxy) ethyl-4-dimethylamino benzoate, 2-(dimethylamino)ethyl benzoate and acrylated amines. Preferably the photoactivator is ethyl-4-dimethylamino benzoate. The photoactivator is preferably present in the composition of this invention in an amount of from about 1.0% to about 4.0% by weight, although the skilled artisan may use more or less as desired.

A plasticizer may also be inclued in the composition of this invention to prevent coating brittleness and to keep the composition pliable if desired. Suitable plasticizers include dibutylphthalate, triarylphosphate and substituted analogs thereof and, preferably, dioctylphthalate. The plasticizer is preferably present in the composition of this invention in an amount of from about 0.5% to about 1.25% by weight, although the skilled artisan may use more or less as desired.

Colarants useful herein include dyes such as Rhodamine, Calcozine, Victoria Blue and methyl violet, and such pigments as the anthraquinone and phthalocyanine types. Generally, the colorant is present in the form of a pigment dispersion which may comprise a mixture of one or more pigments and/or one or more dyes dispersed in a suitable solvent or mixture of solvents. When a colorant is used, it is preferably present in the composition of this invention in an amount of from about 1.5% to about 4.0% by weight, more preferably from about 1.75% to about 3.0% and most preferably from about 2.0% to about 2.75%, although the skilled artisan may use more or less as desired.

In order to form a caoting composition for the production of photographic elements, the composition of this invention may be dissolved in admixture in a solvent or mixture of solvents to facilitate applicaiton of the composition to the substrate. Suitable solvents for this purpose include water, tetrahydrofuran, gammbutylrolactone, glycol ethers such as propylene glycol monomethyl ether and methyl Cellosolve, alcohols such as ehtanol and n-propanol, and ketones such as methyl ethyl ketone, or mixtures thereof. Preferably, the solvent comprises a mixture of tetrahydrofuran, propylene glycol, monomethyl ether and gamma-butyrolactone. In general, the solvent system is evaporated from the coating composition once it is applied to an appropriate substrate, however, some insignificant amount of solvent may remain as residue.

Substrates useful for coating with the composition of this invention to form a photographic element such as a color proofing film, photoresist or lithographic printing plate include sheets of transparent films such as polyester, aluminum and its alloys and other metals, silicon and similar materials which are well known in the art. Preferably, the substrate comprises aluminum. The substrate may first be pretreated by standard graining and/or etching and/or anodizing techniques as are well known in the art, and also may or may not have been treated with a composition such as polyvinyl phosphonic acid, sodium silicate or the like suitable for use as a hydrophilizing agent.

In the production of photographic elements such as lithographic printing plates, an aluminum substrate is first preferably grained by art recognized methods such as by means of a wire brush, a slurry of particulates or by chemical or electrochemical means, for example in an electolyte solution comprising hydrochloric acid. The grained plate is preferably then anodized for example in sulfuric or phosphoric acid in a manner well known in the art. The grained and optionally anodized surface is preferalby then rendered hydrophilic by treatment with polyvinyl phosphonic acid by means which are also known to the skilled artisan. The thusly prepared plate is then coated with the base composition of the present invention, preferably at a coating weight of from about $0.6 g/m^2$ to about $2.5\ g/m^2$, more preferably from about $0.8\ g/m^2$ to about $2.0\ g/m^2$ and most preferably from about $1.2\ g/m^2$ to about $1.5\ g/m^2$, although these coating weights are not critical to the practice of this invention, and dried.

Preferably the thusly prepared photographic element is exposed to actinic radiation through a negative test flat so as to yield as solid 6 on a 21 step Stouffer exposure wedge after development. The exposed plate is then developed with a suitable organic solvent free aqueous developer composition such as a developer which comprises an aqueous solution containing one or more of the following groups:

(a) a sodium, potassium or lithium salt of octyl, decyl or dodecyl monosulfate;

(b) sodium, lithium, potassium or ammonium metasilicate salt; and (c) a lithium, potassium, sodium or ammonium borate salt; and (d) an aliphatic dicarboxylic acid, or sodium, potassium or ammonium salt thereof having from 2 to 6 carbon atoms; and (e) mono-, di-, or tri-sodium or -potassium phosphate.

Other suitable developers include water, benzoic acid or sodium, lithium and potassium benzoates and the hydroxy substituted analogs thereof as well as those developers described in U.S. Pat. No. 4,436,807.

In conventional use, the developed plate is finished with a subtractive finisher such as a hydrophilic polymer. Examples include cold water-soluble dextrin and/or polyvinyl pyrrolidone, a nonionic surfactant, a humectant, an inorganic salt and water, as taught by U.S. Pat. No. 4,213,887.

For the purpose of improving the press performance of a plate prepared as described above, it is known that baking of the exposed and developed plate can result in an increase in the number of quality impressions over that otherwise obtainable. To properly bake the plate, it is first treated with a solution designed to prevent loss of hydrophilicity of the background during baking. An example of an effective solution is disclosed in U.S. Pat No. 4,355,096, the disclosure of which is hereby incorporated herein by reference. The thusly prepared plate is then heat treated by baking at a temperature of from about 180° C. up to the annealing temperature of the substrate, most preferably about 240° C. The effective baking time is inversely proportional to the temperature and averages in the range of from about 2 to about 15 minutes. At 240° C., he time is about 7 minutes.

The following examples are illustrative of the invention but it is understood that the invention is not limited thereto.

EXAMPLE I 16.15 g (0.05 mole) of 3-methoxy-4-diazo-diphenylamine hydrogen sulfate are dissolved in 150 g of $H_3PO_4$ (85%) at room temperature (23° C.).

19.50 g (0.05 mole) of Cymel 300 (hexamethoxymethylmelamine) (commercially available from American Cyanamid) are added to the diazo solution with constant stirring. The contents of the reaction mixture are stirred for 18 hours at room temperature (R.T.). At the end of 18 hours, the reaction mixture is introduced into 300 ml of 10% solution of sodium tetrafluoroborate in water. The precipitated diazo polymer is filtered and washed several times with isopropanol and then dried.

A 1.0% diazo solution in gamma-butyrolactone containing 0.04% phosphoric acid (85%) is whirler coated onto an anodized aluminum substrate. The coated plates are exposed to 25 BAU (a BAU =10 mJ/cm$^2$), developed withw ater and inked. A solid 7 and 3 ghost steps are obtained on a 21-step Stouffler Step Wedge.

A diazo prepared by cocondenseing 3-methoxy-4-diazodiphenylamine hydrogen sulfate with 4,4-bis-methoxy methyl diphenyl ether in 85% phosphoric acid and precipitated as methane sulfonate is used as a control. A 1.0% solution of this diazo is prepated in gamma-butyrolactone containing 0.04% phosphoric acid and whriler coated onto an anodized substrate. The coated plates are exposed to 25 BAU, developed with water and inked. The plates are developable with water, but scums on inking.

EXAMPLE 2

21.55 (0.0666 mole) of 3-methoxy-4-diazodiphenylamine hydrogen sulfate are dissolved in 100.0 g of 85% phosphoric acid at room temperature (26° C.). 13.0 g (0.0333 mole) of Cymel 300 are added to the diazo solution with constant agitation. The reaction mixture is stirred for 17 hours at room temperature. At the end of 17 hours, the reaction mixture is introduced into 300 ml of deionized water containing 15.0 g of sodium salt of fluoboric acid. The diazo precipates out. The diazo is filtered, washed several times with ispropanol and dried. A 1.0% solution of diazo is made in gammbutyrolactone/Dowanol PM (20/80). 0.05 g of phosphoric acid is added to 100.0 g of diazo solution. The diazo solution is whirler coated onto an anodized aluminum substrate. The coated plates are exposed to 25 BAU, developed with water and inked. On inking, solid 6 and 3 ghost steps are obtained.

What is claimed is:

1. A light-sensitive compound having the formula: wherein $R_3$ is selected from the group consisting of phenyl and $C_1$ to $C_4$ alkyl substituted phenyl.

—K— is selected from the group consisting of $$-\underset{\underset{H}{|}}{N}-,$$

—S—, —O—, and —CH$_2$—, or is absent;

$R_1$ and $R_2$ are independently selected from the group consisting of $C_1$ to $C_4$ alkyl, methoxy, ethoxy, butoxy, and H;

X— is an anion; and

R denotes a $C_1$ to $C_4$ alkoxy group.

2. The light-sensitive compound of claim 1 wherein K is NH.

3. The light-sensitive compound of claim 1 wherein R is $CH_3$.

4. The light-sensitive compound of claim 1 wherein X is hydrogen sulfate.

5. The light-sensitive compound of claim 1 wherein X is mesitylene sulfonate.

6. The light-sensitive compound of claim 1 wherein $R_1$ is H and $R_2$ is methoxy.

7. The light-sensitive compound of claim 1 wherein $R_1$ is H; $R_2$ is methoxy, $R_3$ is phenyl, $K_{NH, R\ is\ CH_3}$ and X is hydrogen sulfate.

8. The light-sensitive compound of claim 1 wherein X is selected from the group consisting of $SO_4^+$, $HSO_4^-$, $HSO_3^-$, $PO_4^{3-}$, $H_2PO_4^-$, $HPO_4^=$, $Cl^-$, $Br^-$, and $F^-$.

9. A photographic element which comprises a substrate, and a light-sensitive composition disposed on said substrate, said light-sensitive composition comprising a compound having the formula:

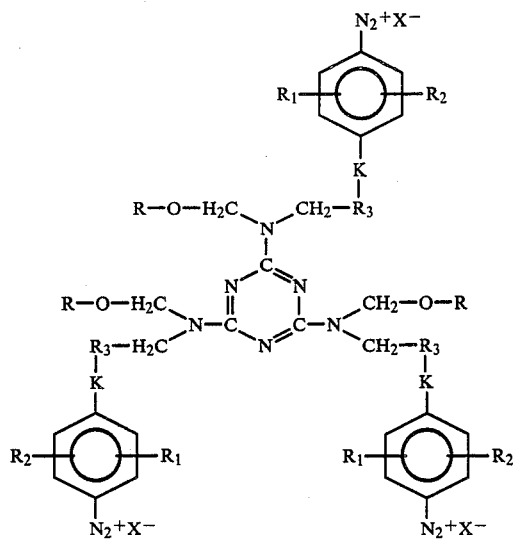

wherein

R₃ is selected from the group consisting of phenyl and C₁ to C₄ alkyl substituted phenyl.

—K— is selected from the group consisting of

—S—, —o—, and —CH₂—, or is absent;

$R_1$ and $R_2$ are independently selected from the group consisting of $C_1$ to $C_4$ alkyl, methoxy, ethoxy, butoxy, and H;

X— is an anion; and

R denotes a $C_1$ to $C_4$ alkyl group.

10. The element of claim 9 wherein K is NH.

11. The element of claim 9 wherein R is $CH_3$.

12. The element of claim 9 wherein X is hydrogen sulfate.

13. The element of claim 9 wherein X is mesitylene sulfonate.

14. The element of claim 9 wherein $R_1$ is H and $R_2$ is methoxy.

15. The element of claim 9 wherein $R_1$ is H, $R_2$ is methoxy, $R_3$ is phenyl, K is NH, R is $CH_3$ and X is hydrogen sulfate.

16. The element of claim 9 wherein said substrate is transparent.

17. The element of claim 9 wherein said substrate comprises polyethylene terephthalate.

18. The element of claim 9 wherein said substrate comprises aluminum.

19. The element of claim 18 wherein the surface of said aluminum substrate has been subjected to one or more treatments selected from the group consisting of graining, anodizing and hydrophilizing.

20. The element of claim 9 wherein said substrate comprises one or more components selected from the group consisting of transparent films, polymeric materials, metals, silicon and semiconductor materials.

21. The element of claim 9 wherein said composition further comprises one or more additional components selected from the group consisting of solvents, acid stabilizers, exposure indicators, binding resins, plasticizers, photoactivators and colorants.

* * * * *